(12) United States Patent
Ishizaki et al.

(10) Patent No.: US 11,906,870 B2
(45) Date of Patent: Feb. 20, 2024

(54) DISPLAY DEVICE

(71) Applicant: Japan Display Inc., Tokyo (JP)

(72) Inventors: Koji Ishizaki, Tokyo (JP); Yoshitaka Ozeki, Tokyo (JP); Takahiro Takeuchi, Tokyo (JP); Koshiro Moriguchi, Tokyo (JP); Tomoyasu Hirano, Tokyo (JP)

(73) Assignee: Japan Display Inc., Tokyo (JP)

( * ) Notice: Subject to any disclaimer, the term of this patent is extended or adjusted under 35 U.S.C. 154(b) by 780 days.

(21) Appl. No.: 17/071,088

(22) Filed: Oct. 15, 2020

(65) Prior Publication Data

US 2021/0026215 A1 Jan. 28, 2021

Related U.S. Application Data

(63) Continuation of application No. PCT/JP2019/006233, filed on Feb. 20, 2019.

(30) Foreign Application Priority Data

Apr. 19, 2018 (JP) ................................ 2018-080343

(51) Int. Cl.
| | | |
|---|---|---|
| *G02F 1/167* | (2019.01) | |
| *G02F 1/16766* | (2019.01) | |
| *G02F 1/16756* | (2019.01) | |
| G02F 1/16757 | (2019.01) | |
| G02F 1/1675 | (2019.01) | |

(52) U.S. Cl.
CPC .......... *G02F 1/16766* (2019.01); *G02F 1/167* (2013.01); *G02F 1/16756* (2019.01); *G02F 1/16757* (2019.01); *G02F 2001/1678* (2013.01)

(58) Field of Classification Search
CPC .. G02F 1/16766; G02F 1/167; G02F 1/16756; G02F 1/16757
See application file for complete search history.

(56) References Cited

U.S. PATENT DOCUMENTS

2015/0279872 A1   10/2015  Kato et al.

FOREIGN PATENT DOCUMENTS

| JP | 2011-221097 A | 11/2011 | |
|---|---|---|---|
| JP | 2015-191038 | * 11/2015 | ............... G09F 9/30 |
| JP | 2015-191038 A | 11/2015 | |

OTHER PUBLICATIONS

Japanese Office Action dated Apr. 19, 2022 in Japanese Patent Application No. 2018-080343 (submitting unedited computer generated English translation only), 4 pages.
International Search Report dated May 7, 2019 in PCT/JP2019/006233 filed Feb. 20, 2019, 1 page.

* cited by examiner

*Primary Examiner* — Joseph P Martinez
(74) *Attorney, Agent, or Firm* — Maier & Maier, PLLC

(57) ABSTRACT

According to one embodiment, a display device includes a first conductive layer, a second conductive layer overlapping the first conductive layer, a first capacitive portion located in a same layer as the first conductive layer, a second capacitive portion located in a same layer as the second conductive layer and overlapping the first capacitive portion, a first inorganic insulating film located between the first conductive layer and the second conductive layer and between the first capacitive portion and the second capacitive portion, a drain electrode electrically connected to the second capacitive portion, a pixel electrode electrically connected to the drain electrode.

16 Claims, 13 Drawing Sheets

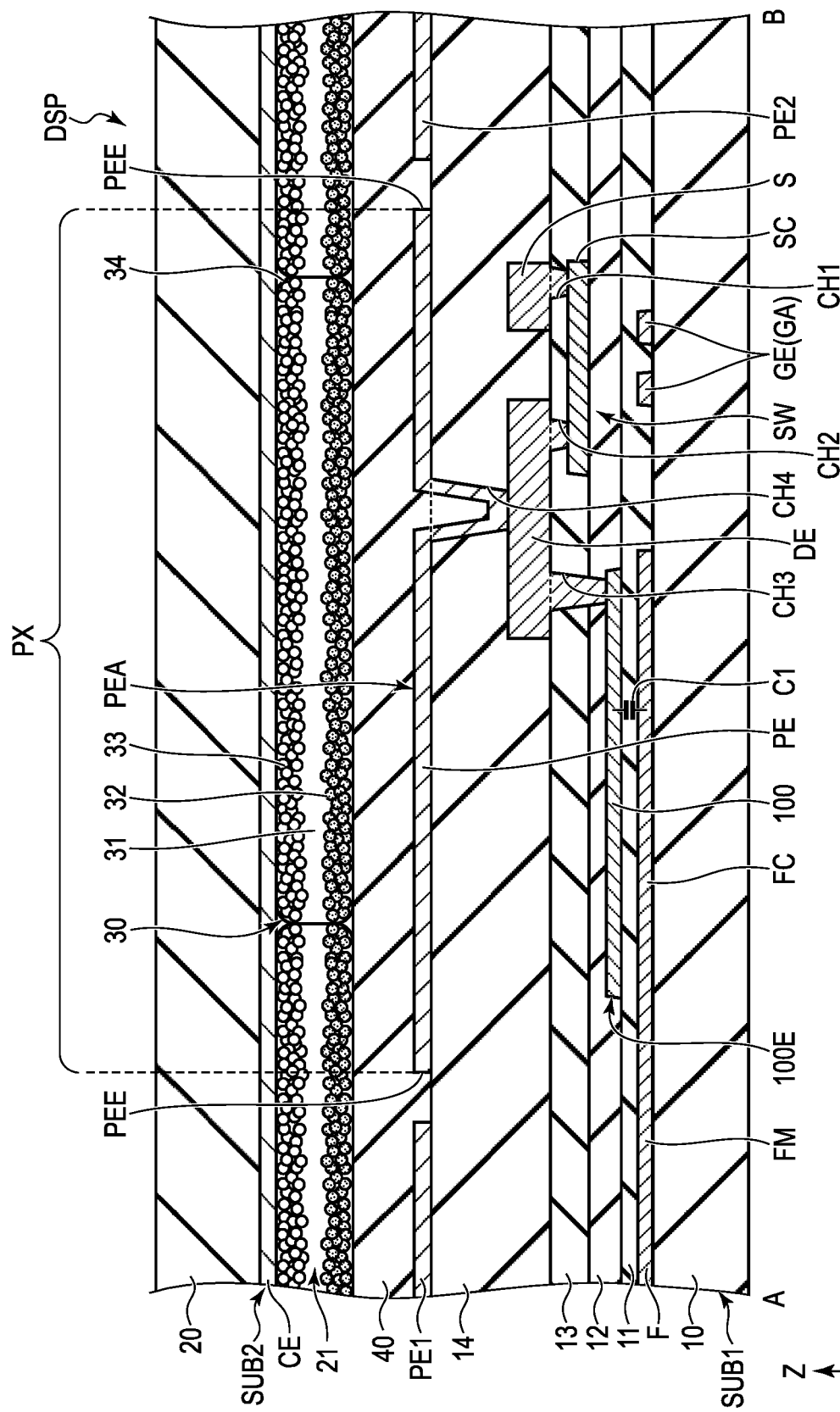
F I G. 3

DISPLAY DEVICE

CROSS-REFERENCE TO RELATED APPLICATIONS

This application is a Continuation Application of PCT Application No. PCT/JP2019/006233, filed Feb. 20, 2019 and based upon and claiming the benefit of priority from Japanese Patent Application No. 2018-080343, filed Apr. 19, 2018, the entire contents of all of which are incorporated herein by reference.

FIELD

Embodiments described herein relate generally to a display device.

BACKGROUND

For example, an electrophoretic display device which holds an electrophoretic element between an element substrate and a counter-substrate has been disclosed. It is disclosed that, according to this electrophoretic display device, a capacitive electrode is formed substantially over the entire surface of a display portion, and all pixel electrodes overlap the capacitive electrode. In such an electrophoretic display device, an electric field from the capacitive electrode may leak in a gap between the pixel electrodes which are adjacent to each other. The leakage electric field between the pixel electrodes may cause a malfunction of the electrophoretic element and cause display quality degradation.

BRIEF DESCRIPTION OF THE DRAWINGS

FIG. 3 is a cross-sectional view along line A-B of the display device DSP including the pixel PX shown in FIG. 2.

DETAILED DESCRIPTION

Figure 1:
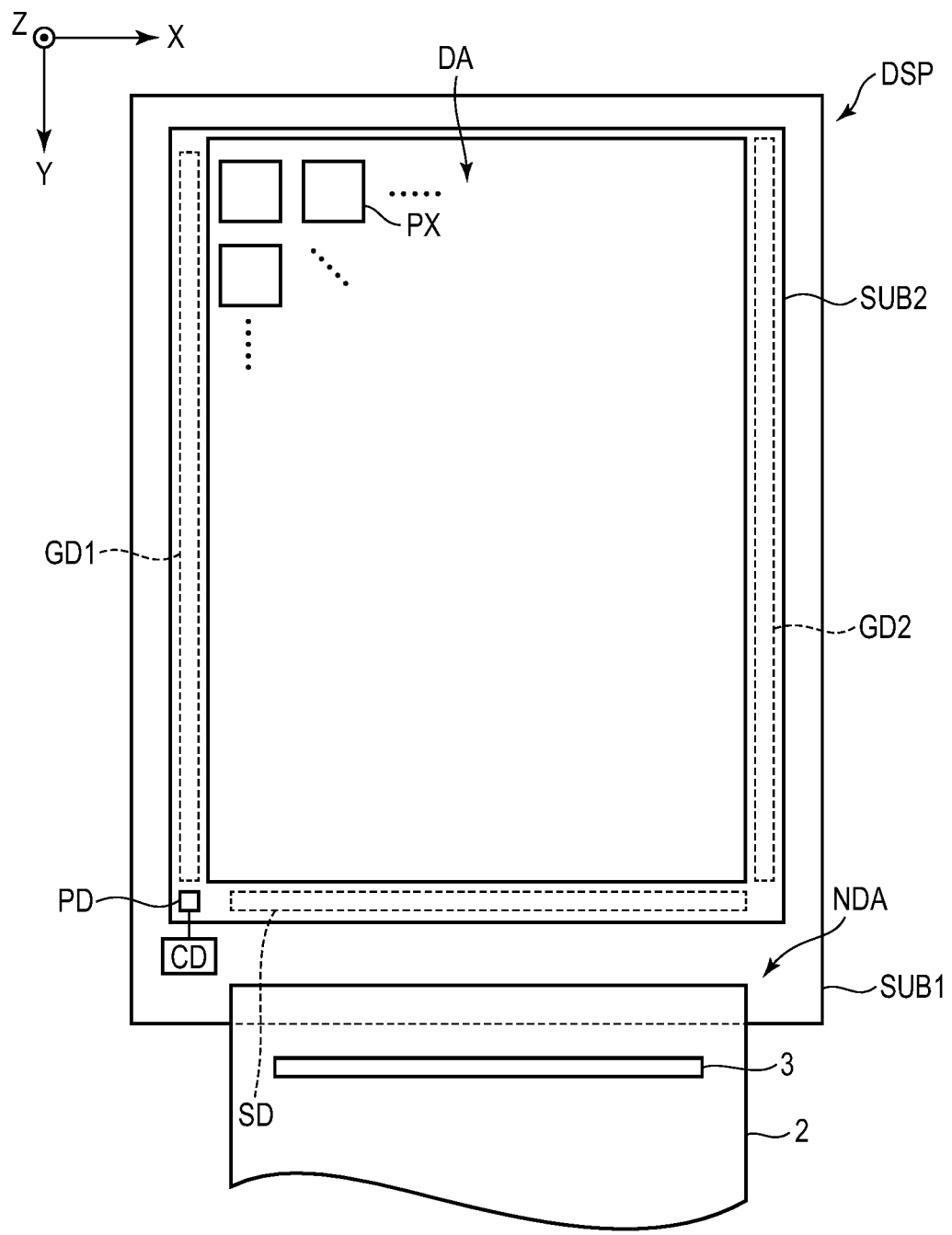
FIG. 1 is a plan view showing an example of a display device DSP of the present embodiment.

In general, according to one embodiment, there is provided a display device including a base, a scanning line including a first conductive layer and a second conductive layer overlapping the first conductive layer, a first capacitive portion located in a same layer as the first conductive layer, a second capacitive portion located in a same layer as the second conductive layer and overlapping the first capacitive portion, a first inorganic insulating film located between the first conductive layer and the second conductive layer and between the first capacitive portion and the second capacitive portion, a switching element including a drain electrode electrically connected to the second capacitive portion and a semiconductor layer electrically connected to the drain electrode, a pixel electrode electrically connected to the drain electrode, a common electrode having a same potential as the first capacitive portion, and an electrophoretic element located between the pixel electrode and the common electrode.

The present embodiment will be described hereinafter with reference to the accompanying drawings. The disclosure is merely an example, and proper changes in keeping with the spirit of the invention, which are easily conceivable by a person of ordinary skill in the art, come within the scope of the invention as a matter of course. In addition, in some cases, in order to make the description clearer, the widths, thicknesses, shapes, and the like of the respective parts are illustrated schematically in the drawings, rather than as an accurate representation of what is implemented, but such schematic illustration is merely exemplary, and in no way restricts the interpretation of the invention. In addition, in the specification and drawings, constituent elements which function in the same or a similar manner to those described in connection with preceding drawings are denoted by the same reference symbols, and detailed explanations of them that are considered redundant may be appropriately omitted.

FIG. 1 is a plan view showing an example of a display device DSP of the present embodiment. A first direction X, a second direction Y and a third direction Z are, for example, orthogonal to one another but may cross one another at an angle other than 90 degrees. The first direction X and the second direction Y correspond to directions parallel to a main surface of a substrate constituting the display device DSP, and the third direction Z corresponds to a thickness direction of the display device DSP. In the present specification, a position on a front end side of an arrow indicating the third direction Z will be referred to as higher (or simply as above), and a position on a rear end side of the arrow will be referred to as lower (or simply as below). When described as "the second member above the first member" and "the second member below the first member", the second member may be in contact with the first member or apart from the first member. In addition, when an observation position at which the display device DSP is observed is located on the front end side of the arrow indicating the third direction Z, viewing from this observation position toward an X-Y plane defined by the first direction X and the second direction Y will be referred to as planar view.

The display device DSP includes a first substrate SUB1 and a second substrate SUB2. A display portion DA which displays an image is located in an area in which the first substrate SUB1 and the second substrate SUB2 overlap in planar view. The display portion DA includes a plurality of pixels PX arranged in a matrix in the first direction X and the second direction Y. A non-display portion NDA around the display portion DA is formed in a frame shape. Gate drivers GD1 and GD2 and a source driver SD are located in the non-display portion NDA and are disposed in the first substrate SUB1. In addition, a feed pad PD is located in the non-display portion NDA, is disposed in the first substrate SUB1, and overlaps the second substrate SUB2. The feed pad PD is connected to a power source CD of a common potential.

A flexible printed circuit board 2 is connected to the first substrate SUB1. An IC chip 3 is connected to the flexible printed circuit board 2. Note that the IC chip 3 may be connected to the first substrate SUB1. The gate drivers GD1 and GD2, the source driver SD and the power source DC may be incorporated in the IC chip 3.

Figure 2:
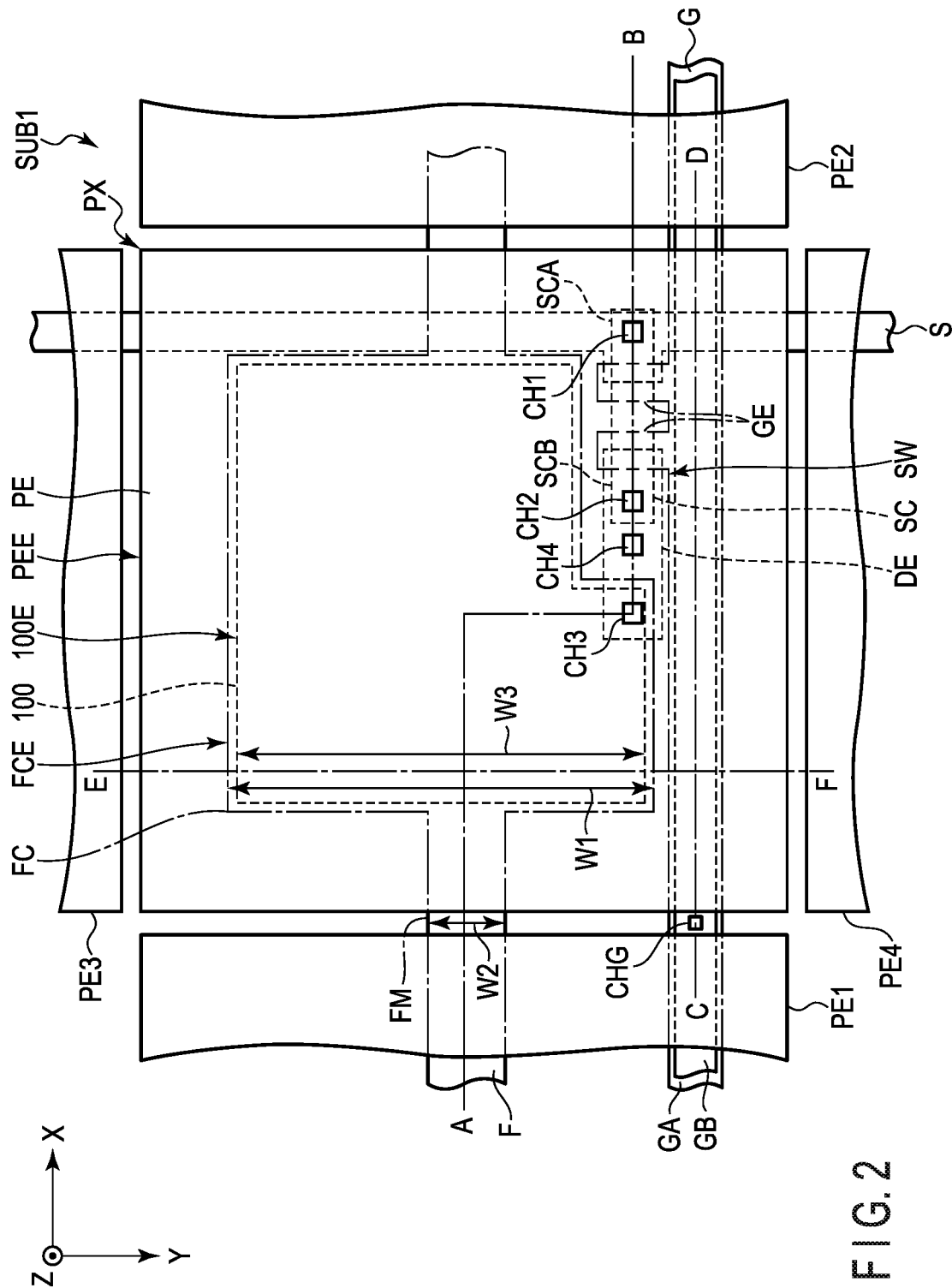
FIG. 2 is a plan view showing the first configuration example of a pixel PX of the display device DSP shown in FIG. 1.

FIG. 2 is a plan view showing the first configuration example of the pixel PX of the display device DSP shown in FIG. 1. Only main elements of the pixel PX which are disposed in the first substrate SUB1 shown in FIG. 1 are illustrated here. The first substrate SUB1 includes a scanning line G, a signal line S, a feed line F, a switching element SW, a pixel electrode PE and a capacitive electrode 100.

The scanning line G and the feed line F are arranged with a space in between in the second direction Y and do not cross each other. The scanning line G is composed of a multilayer body including a plurality of conductive layers GA and GB. The scanning line G includes two conductive layers GA and GB in the illustrated example but may include three or more conductive layers. The conductive layers GA and GB are electrically connected to each other and have the same potential. In the illustrated example, a through hole CHG is located between the pixel electrode PE and a pixel electrode PE1, and the conductive layers GA and GB are electrically connected to each other in the through hole CHG. The conductive layers GA and GB extend along the first direction X and are connected to either one of the gate drivers GD1 and GD2 shown in FIG. 1. According to such a configuration, even if the width of the scanning line G is reduced in accordance with achievement of high definition, an increase in wiring line resistance can be suppressed. In addition, even if one of the conductive layers GA and GB is broken, the other conductive layer can make a broken position electrically continuous, and reliability degradation can be suppressed.

The feed line F includes a main body FM and a capacitive portion FC. The main body FM and the capacitive portion FC are integrally formed. The main body FM extends along the first direction X and is electrically connected to the power source CD of the common potential shown in FIG. 1. The capacitive portion FC is made wider in the second direction Y than the main body FM within the pixel PX. A width W1 of the capacitive portion FC is greater than a width W2 of the main body FM. The widths here are lengths along the second direction Y.

The capacitive electrode 100 is formed in an island shape and overlaps the capacitive portion FC within the pixel PX. In order to reduce a load caused by a parasitic capacitance, the capacitive electrode 100 does not overlap any of the scanning line G, the signal line S and the switching element SW. A width W3 of the capacitive electrode 100 is substantially equal to the width W1 and is greater than the width W2. The capacitive electrode 100 and the capacitive portion FC overlap the pixel electrode PE.

The signal line S extends along the second direction Y and is connected to the source driver SD shown in FIG. 1. The signal line S crosses the scanning line G and the feed line F.

The switching element SW is located in a portion in which the scanning line G and the signal line S cross each other. The switching element SW includes a semiconductor layer SC, a gate electrode GE and a drain electrode DE. The illustrated switching element SW has a double-gate structure but may have a single-gate structure. In addition, the switching element SW may have a top-gate structure in which the gate electrode GE is arranged above the semiconductor layer SC or a bottom-gate structure in which the gate electrode GE is arranged below the semiconductor layer SC.

The semiconductor layer SC includes an end portion SCA overlapping the signal line S and an end portion SCB overlapping the drain electrode DE. The end portion SCA is electrically connected to the signal line S in a through hole CH1. The end portion SCB is electrically connected to the drain electrode DE in a through hole CH2. The semiconductor layer SC crosses the scanning line G between the end portion SCA and the end portion SCB. The gate electrode GE corresponds to an area of the scanning line G which overlaps the semiconductor layer SC. The conductive layer GA includes the gate electrode GE in the illustrated example, but the conductive layer GB may include the gate electrode GE or both of the conductive layers GA and GB may include the gate electrode GE. The drain electrode DE is formed in an island shape and is electrically connected to the capacitive electrode 100 in a through hole CH3.

In the pixel PX, the pixel electrode PE overlaps the capacitive electrode 100, the switching element SW, the scanning line G, the signal line S and the feed line F. The pixel electrode PE is electrically connected to the drain electrode DE in a through hole CH4. That is, the pixel electrode PE is electrically connected to the capacitive electrode 100 via the drain electrode DE. Therefore, the pixel electrode PE and the capacitive electrode 100 have the same potential. In the illustrated example, the pixel electrode PE is formed in a square shape whose length along the first direction X and length along the second direction Y are equal to each other. However, the pixel electrode PE is not limited to this example. The pixel electrode PE may be formed in a rectangular shape extending in the first direction X or the second direction Y or may be formed in another polygonal shape.

In planar view, an edge 100E of the capacitive electrode 100 overlaps the pixel electrode PE over its entire circumference as shown by a dotted line. In addition, an edge FCE of the capacitive portion FC overlaps the pixel electrode PE over its entire circumference as shown by a dashed dotted line. That is, the capacitive electrode 100 and the capacitive portion FC do not extend on the outer side of the pixel electrode PE. An edge PEE of the pixel electrode PE is located more outward than the capacitive electrode 100.

As shown in the drawing, four pixel electrodes PE1 to PE4 are arranged around the pixel electrode PE. The capacitive electrode 100 is not present between the pixel electrode PE and the pixel electrode PE1, between the pixel electrode PE and the pixel electrode PE2, between the pixel electrode PE and the pixel electrode PE3, and between the pixel electrode PE and the pixel electrode PE4.

FIG. 3 is a cross-sectional view along line A-B of the display device DSP including the pixel PX shown in FIG. 2. The first substrate SUB1 further includes a base 10 and insulating films 11 to 14. The base 10 is an insulating substrate formed of insulating glass or resin such as polyimide resin. Since the base 10 is located on a side opposite to the observation position with respect to the second substrate SUB2, the base 10 may be an opaque base or a transparent base.

The gate electrode GE integrally formed with the conductive layer GA and the feed line F including the main body FM and the capacitive portion FC are located on the base 10 and are covered with the insulating film 11. The conductive layer GA and the feed line F are located in the same layer and are formed of the same material. The capacitive electrode 100 is located on the insulating film 11 and is covered with the insulating film 12. The capacitive electrode 100 overlaps the capacitive portion FC via the insulating film 11 and forms a capacitance C1 of the pixel PX. The insulating film 11 is in contact with the base 10 and the insulating film 12.

The conductive layer GA, the feed line F and the capacitive electrode 100 are each formed of a metal material such as aluminum (Al), titanium (Ti), silver (Ag), molybdenum (Mo), tungsten (W), copper (Cu) or chromium (Cr), an alloy of these metal materials combined together, or the like, and may have a single-layer structure or a multilayer structure.

The semiconductor layer SC is located on the insulating film 12 and is covered with the insulating film 13. The semiconductor layer SC is formed of, for example, polycrystalline silicon (for example, low-temperature polysilicon) but may be formed of amorphous silicon or oxide semiconductor. The insulating film 12 is in contact with the insulating films 11 and 13.

The signal line S and the drain electrode DE are located on the insulating film 13 and are covered with the insulating film 14. The signal line S and the drain electrode DE are located in the same layer and are formed of the same material. The signal line S is in contact with the semiconductor layer SC in the through hole CH1 which penetrates the insulating film 13. The drain electrode DE is in contact with the semiconductor layer SC in the through hole CH2 which penetrates the insulating film 13. In addition, the drain electrode DE is in contact with the capacitive electrode 100 in the through hole CH3 which penetrates the insulating films 12 and 13. The insulating film 13 is in contact with the insulating films 12 and 14.

The pixel electrode PE is located on the insulating film 14. The pixel electrode PE is in contact with the drain electrode DE in the through hole CH4 which penetrates the insulating film 14. The pixel electrode PE is, for example, a transparent electrode formed of a transparent conductive material such as indium tin oxide (ITO) or indium zinc oxide (IZO).

Directly above the edge 100E of the capacitive electrode 100, the pixel electrode PE is located. Note that the edge PEE may be located directly above the edge 100E. Directly below the edge PEE of the pixel electrode PE, the insulating films 11 to 14 are stacked in this order. In addition, the insulating films 11 to 14 are also stacked in this order between the pixel electrode PE1 and the pixel electrode PE and between the pixel electrode PE and the pixel electrode PE2.

All the insulating film 11, the insulating film 12 and the insulating film 13 correspond to an inorganic insulating film formed of an inorganic material such as silicon oxide (SiO), silicon nitride (SiN) or silicon oxynitride (SiON). The insulating film 11, the insulating film 12 and the insulating film 13 may have a single-layer structure or a layer stack structure. The insulating film 14 corresponds to an organic insulating film formed of an organic material such as acrylic resin. The insulating film 14 is made thicker than any of the above-described inorganic insulating films (insulating films 11 to 13).

The second substrate SUB2 includes a base 20, a common electrode CE and an electrophoretic element 21. In the illustrated example, the second substrate SUB2 does not include a light-shielding layer which delimits the pixel PX. The base 20 is an insulating substrate formed of insulating glass or resin such as polyimide resin. Since the base 20 is located on an observation position side with respect to the first substrate SUB1, the base 20 is a transparent base. The common electrode CE is located between the base 20 and the electrophoretic element 21. The common electrode CE is a transparent electrode formed of a transparent conductive material such as ITO or IZO. The common electrode CE is electrically connected to the feed pad PD in the non-display portion NDA shown in FIG. 1. That is, the common electrode CE has the same potential as the feed line F and the capacitive portion FC. The electrophoretic element 21 is located between the pixel electrode PE and the common electrode CE. The electrophoretic element 21 is formed of a plurality of microcapsules 30 arrayed tightly with almost no space in between in the X-Y plane.

The first substrate SUB1 and the second substrate SUB2 are bonded together by an adhesive layer 40. In the illustrated example, the adhesive layer 40 is located between the pixel electrode PE and the electrophoretic element 21. Between the pixel electrode PE1 and the pixel electrode PE and between the pixel electrode PE and the pixel electrode PE2, the electrophoretic element 21 is bonded to the insulating film 14 by the adhesive film 40.

The microcapsules 30 have a particle diameter of, for example, about 20 μm to 70 μm. More than one microcapsule 30 is arranged between one pixel electrode PE and the common electrode CE. For example, about one to ten microcapsules 30 are arranged above the pixel electrode PE having a rectangular or polygonal shape whose side lengths are about one to several hundred micrometers.

The microcapsule 30 includes a dispersion medium 31, a plurality of black particles 32 and a plurality of white particles 33. The black particles 32 and the white particles 33 may be referred to also as electrophoretic particles. An outer shell 34 of the microcapsule 30 is formed of, for example, transparent resin such as acrylic resin. The dispersion medium 31 is a liquid which disperses the black particles 32 and the white particles 33 within the microcapsule 30. The black particles 32 and the white particles 33 have electric charge having opposite polarity. For example, the black particles 32 are positively charged, and the white particles 33 are negatively charged. Note that, other than the black particles 32 and the white particles 33, the microcapsule 30 may include electrophoretic particles having other colors such as red, green, blue, yellow, cyan and magenta. In addition, the electrophoretic particles having the above-described other colors may be replaced with at least one of the black particles 32 and the white particles 33.

In the electrophoretic element 21 of the above-described configuration, when the pixel PX displays black, the pixel electrode PE is held at a high potential relative to the common electrode CE. That is, when the potential of the common electrode CE is a reference potential, the pixel electrode PE is held at positive polarity. Accordingly, while the positively charged black particles 32 are attracted to the common electrode CE, the negatively charged white particles 33 are attracted to the pixel electrode PE. As a result, when the pixel PX is observed from above the second substrate SUB2, the pixel PX is visually recognized as black.

On the other hand, when the pixel PX displays white, the pixel electrode PE is held at a low potential relative to the common electrode CE. That is, when the potential of the common electrode CE is a reference potential, the pixel electrode PE is held at negative polarity. Accordingly, while the negatively charged white particles 33 are attracted to the common electrode CE, the positively charged black particles 32 are attracted to the pixel electrode PE. As a result, when the pixel PX is observed, the pixel PX is visually recognized white.

Figure 4:
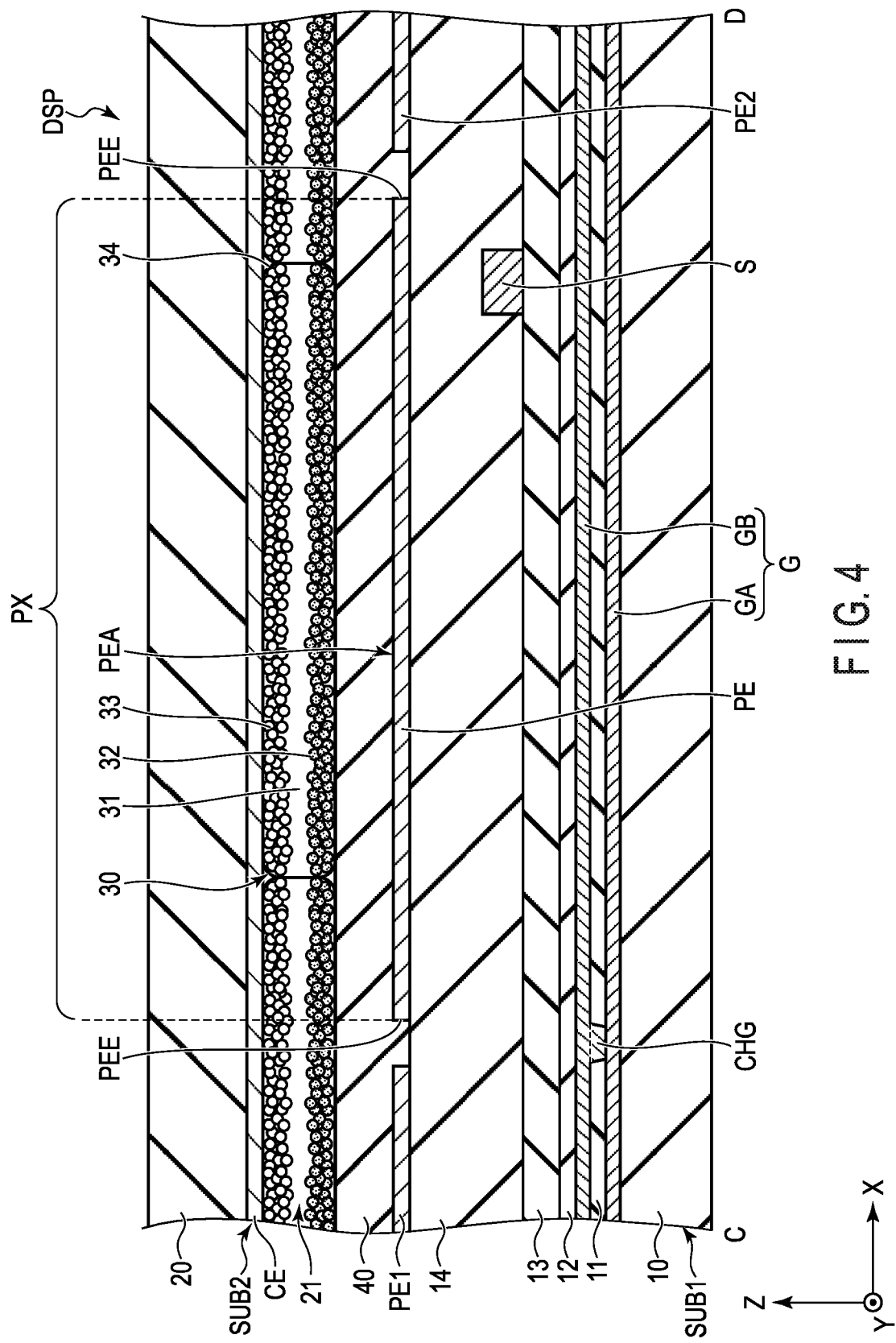
FIG. 4 is a cross-sectional view along line C-D of the display device DSP including the pixel PX shown in FIG. 2.

FIG. 4 is a cross-sectional view along line C-D of the display device DSP including the pixel PX shown in FIG. 2. The conductive layer GB is located above the conductive layer GA. The conductive layer GB is located on the insulating film 11 and is covered with the insulating film 12. The conductive layer GB and the capacitive electrode 100 are located in the same layer and are formed of the same material. The conductive layers GA and GB each extend continuously along the first direction X. The conductive layer GB is in contact with the conductive layer GA in the through hole CHG which penetrates the insulating film 11.

Figure 5:
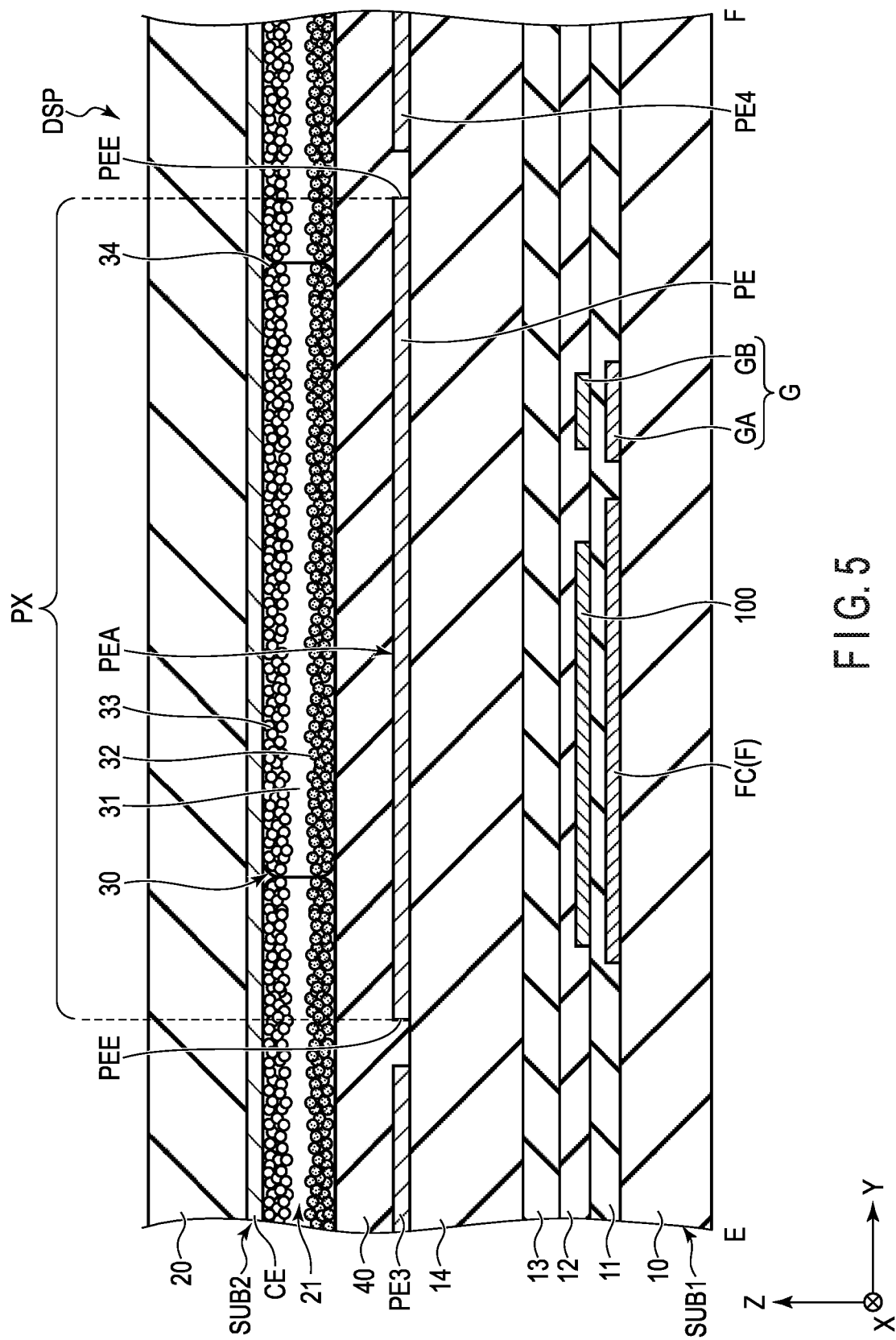
FIG. 5 is a cross-sectional view along line E-F of the display device DSP including the pixel PX shown in FIG. 2.

FIG. 5 is a cross-sectional view along line E-F of the display device DSP including the pixel PX shown in FIG. 2. As described above, the conductive layer GA and the feed line F are located between the base 10 and the insulating film 11. In addition, between the conductive layer GA and the feed line F, the insulating film 11 is in contact with the base 10. The conductive layer GB and the capacitive electrode 100 are located between the insulating film 11 and the insulating film 12. In addition, between the conductive layer GB and the capacitive electrode 100, the insulating film 12 is in contact with the insulating film 11. The insulating film 11 is located between the conductive layer GA and the conductive layer GB and is located between the capacitive portion FC and the capacitive electrode 100.

In the first configuration example shown in FIGS. 2 to 5, the conductive layer GA corresponds to a first conductive layer, the capacitive portion FC corresponds to a first capacitive portion, the conductive layer GB corresponds to a second conductive layer, the capacitive electrode 100 corresponds to a second capacitive portion, the insulating film 11 corresponds to a first inorganic insulating film, the insulating film 12 corresponds to a second inorganic insulating film, the insulating film 13 corresponds to a third inorganic insulating film, and the insulating film 14 corresponds to an organic insulating film.

According to the present embodiment, the scanning line G is multilayered so as to ensure reliability, and the capacitance C1 required for the pixel PX is formed between the capacitive portion FC formed in the same layer as the conductive layer GA of the scanning line G and the capacitive electrode 100 formed in the same layer as the conductive layer GB of the scanning line G. In addition, the insulating film 14 which is an organic insulating film is interposed between the capacitive portion FC and the pixel electrode PE. Therefore, the capacitive portion FC and the capacitive electrode 100 can be arranged away from the electrophoretic element 21. Consequently, an undesired electric field leakage which impacts on the electrophoretic element 21 from the capacitive portion FC (or the feed line F) can be suppressed. Furthermore, the electric field intensity can be made uniform substantially over the entire area of an upper surface PEA including the vicinity of the edge PEE of the pixel electrode PE. Accordingly, a malfunction of the electrophoretic element 21 can be suppressed, and display quality degradation can be suppressed.

In addition, the capacitive portion FC is formed in the same process as the conductive layer GA, and the capacitive electrode 100 is formed in the same process as the conductive layer GB. Therefore, separate process is not required for forming the capacitive portion FC and the capacitive electrode 100.

Furthermore, as compared with a comparative example where a capacitive electrode is separately disposed between the insulating film 14 and the pixel electrode PE, the number of manufacturing processes is reduced, and the number of layers of the first substrate SUB1 is reduced. Therefore, the manufacturing cost can be reduced.

Next, other configuration examples will be described. In the configuration examples, the same configurations as those of the first configuration example may be denoted by the same reference symbols and explanations of them may be omitted.

Figure 6:
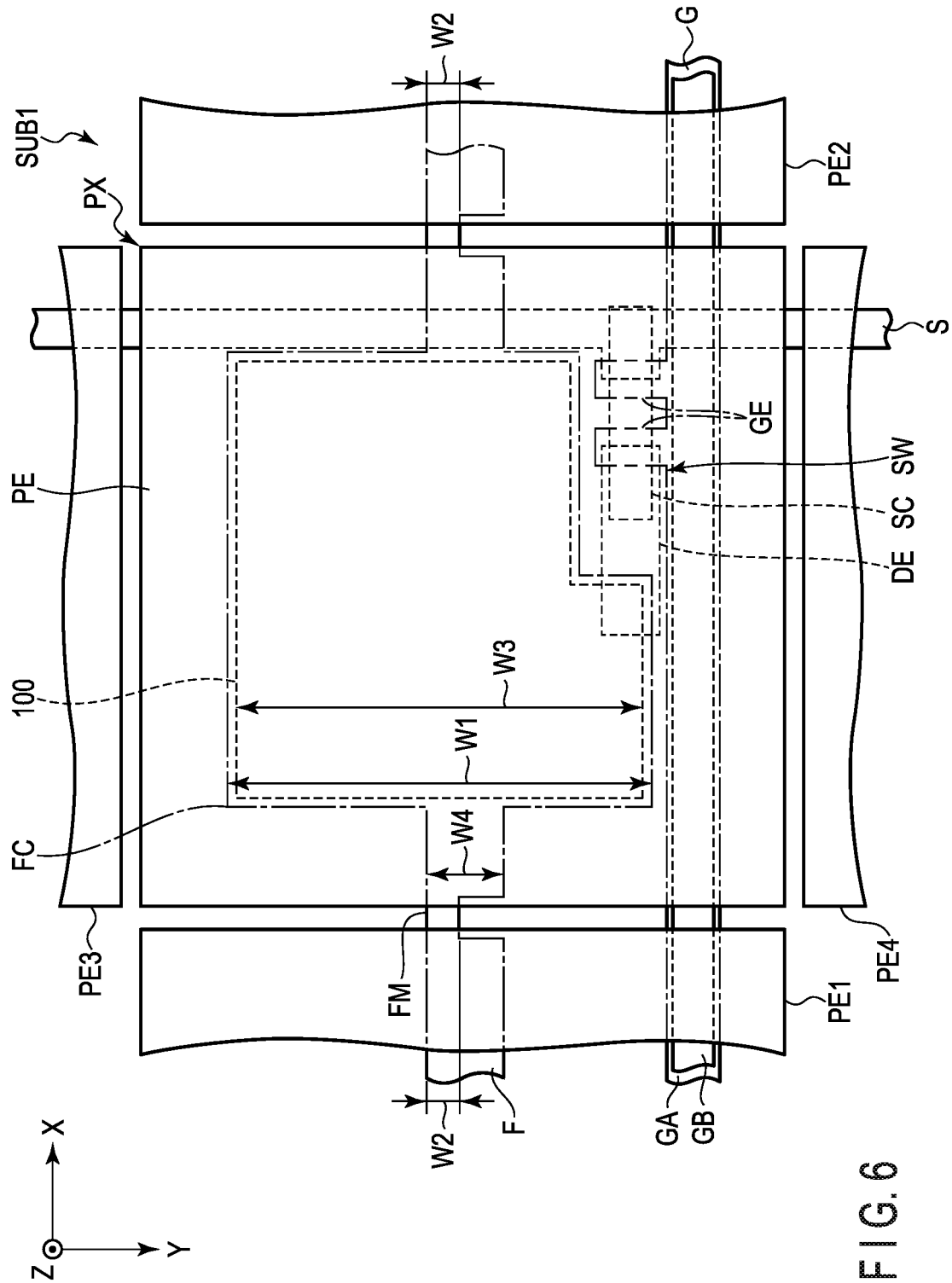
FIG. 6 is a plan view showing the second configuration example of the pixel PX of the display device DSP shown in FIG. 1.

FIG. 6 is a plan view showing the second configuration example of the pixel PX of the display device DSP shown in FIG. 1. The second configuration example shown in FIG. 6 is different from the first configuration example shown in FIG. 2 in that the width of the feed line F is reduced between the pixel electrode PE1 and the pixel electrode PE and between the pixel electrode PE and the pixel electrode PE2. In the feed line F, a width W4 at a position overlapping the pixel electrode PE is less than the width W1 of capacitive portion FC, and the width W2 between the pixel electrode PE1 and the pixel electrode PE is less than the width W4. In addition, the width W2 between the pixel electrode PE and the pixel electrode PE2 is also less than the width W4.

According to the second configuration example, substantially the same effects as those of the above-described first configuration example can be obtained. Furthermore, even if an electric field leaks from the feed line F between the pixel electrodes which are adjacent to each other, since the width of the feed line F is reduced, the impact of the electric field on the electrophoretic element 21 can be reduced.

Figure 7:
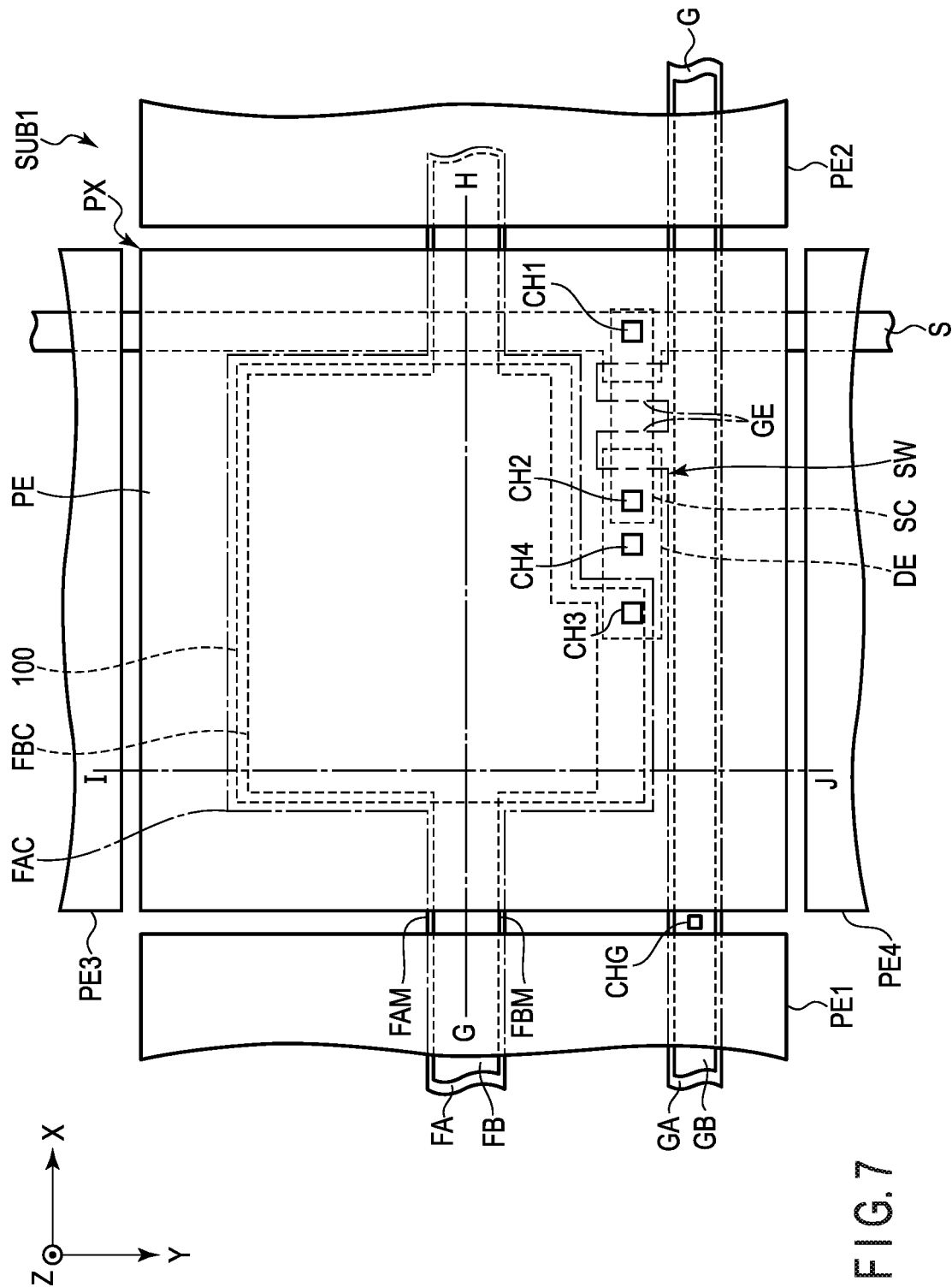
FIG. 7 is a plan view showing the third configuration example of the pixel PX of the display device DSP shown in FIG. 1.

FIG. 7 is a plan view showing the third configuration example of the pixel PX of the display device DSP shown in FIG. 1. The third configuration example shown in FIG. 7 is different from the first configuration example shown in FIG. 2 in further including capacitive portions FAC and FBC overlapping the capacitive electrode 100. A feed line FA corresponds to the feed line F shown in FIG. 2 and includes a main body FAM and the capacitive portion FAC. A feed line FB overlaps the feed line FA and includes a main body FBM and the capacitive portion FBC. The main body FBM overlaps the main body FAM, and the capacitive portion FBC overlaps the capacitive electrode 100. Both of the feed lines FA and FB are connected to the power source CD shown in FIG. 1. That is, the capacitive portion FAC has the same potential as the capacitive portion FBC. All the capacitive portion FAC, the capacitive electrode 100 and the capacitive portion FBC overlap the pixel electrode PE.

Figure 8:
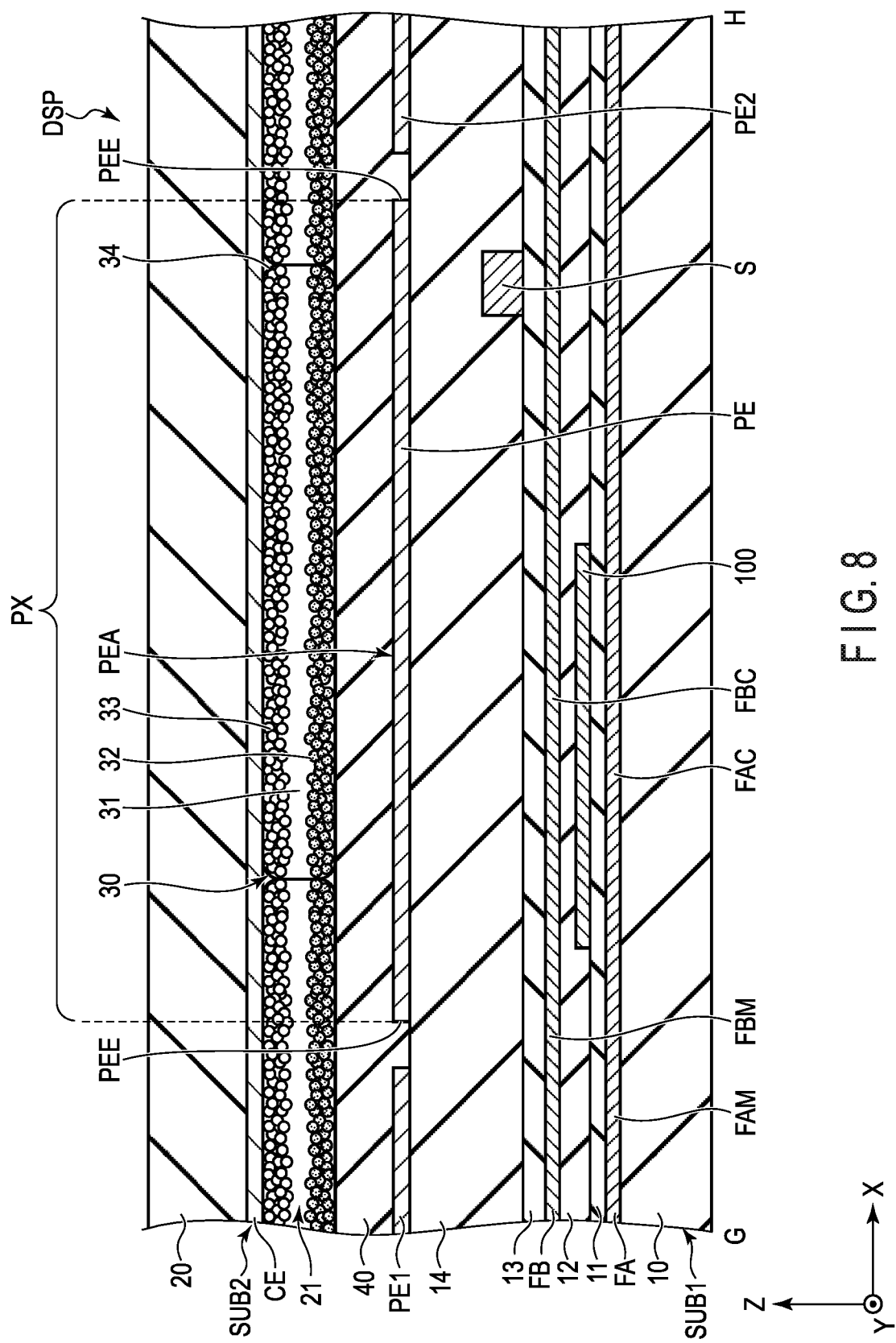
FIG. 8 is a cross-sectional view along line G-H of the display device DSP including the pixel PX shown in FIG. 7.

FIG. 8 is a cross-sectional view along line G-H of the display device DSP including the pixel PX shown in FIG. 7. The feed line FB is located above the feed line FA. The capacitive electrode 100 is located between the feed line FA and the feed line FB. The capacitive electrode 100 is located above the capacitive portion FAC, and the capacitive portion FBC is located above the capacitive electrode 100.

The feed line FB is located on the insulating film 12 and is covered with the insulating film 13. The feed line FB is located in the same layer as the semiconductor layer SC shown in FIG. 3 but is apart from the semiconductor layer SC. The feed line FB is formed of, for example, the same material as the semiconductor layer SC, and is formed of polycrystalline silicon. Note that the feed line FB may be formed of a conductive material having a lower resistance than the semiconductor layer SC. The capacitive portion FBC is formed as a part of the feed line FB in the illustrated example but is not limited to this example. For example, the capacitive portion FBC may be formed in an island shape in each pixel PX, and may be electrically connected to the capacitive portion FAC.

Figure 9:
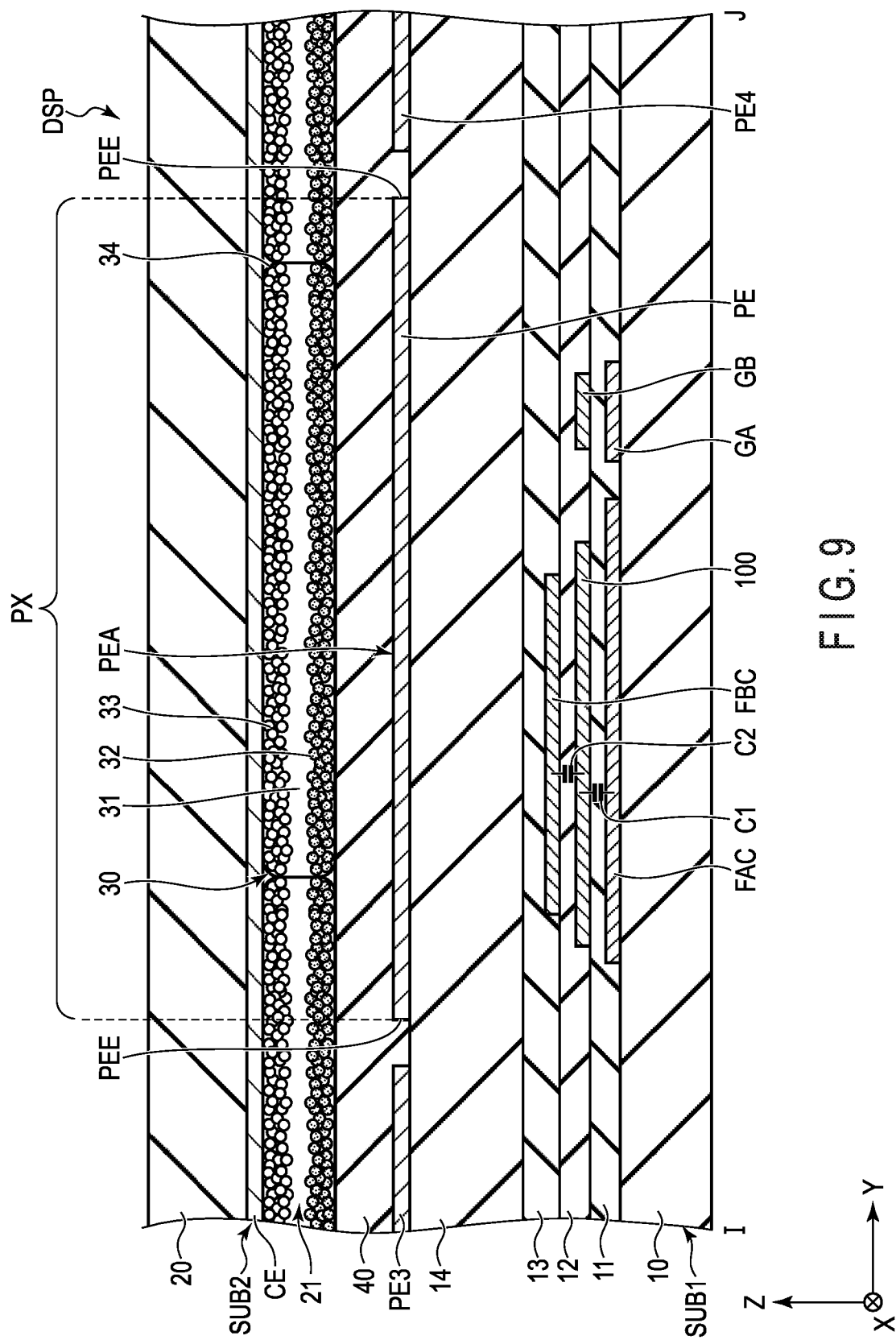
FIG. 9 is a cross-sectional view along line I-J of the display device DSP including the pixel PX shown in FIG. 7.

FIG. 9 is a cross-sectional view along line I-J of the display device DSP including the pixel PX shown in FIG. 7. The insulating film 11 is located between the conductive layer GA and the conductive layer GB and is located between the capacitive portion FAC and the capacitive electrode 100. The insulating film 12 is located between the capacitive electrode 100 and the capacitive portion FBC. The capacitive electrode 100 overlaps the capacitive portion FAC via the insulating film 11 and forms the capacitance C1 of the pixel PX. Furthermore, the capacitive portion FBC overlaps the capacitive electrode 100 via the insulating film 12 and forms a capacitance C2 of the pixel PX.

In the third configuration example shown in FIGS. 7 to 9, the capacitive portion FAC corresponds to the first capacitive portion, the capacitive electrode 100 corresponds to the second capacitive portion, and the capacitive portion FBC corresponds to a third capacitive portion.

According to the third configuration example, substantially the same effects as those of the above-described first configuration example can be obtained. In addition, in each pixel PX, not only the capacitance C1 between the capacitive portion FAC and the capacitive electrode 100 but also the capacitance C2 between the capacitive electrode 100 and the capacitive portion FBC can be formed. Since the capacitances C1 and C2 are formed by the multilayer conductive layer, even when the size of the pixel PX is small, higher capacitance can be formed.

Figure 10:
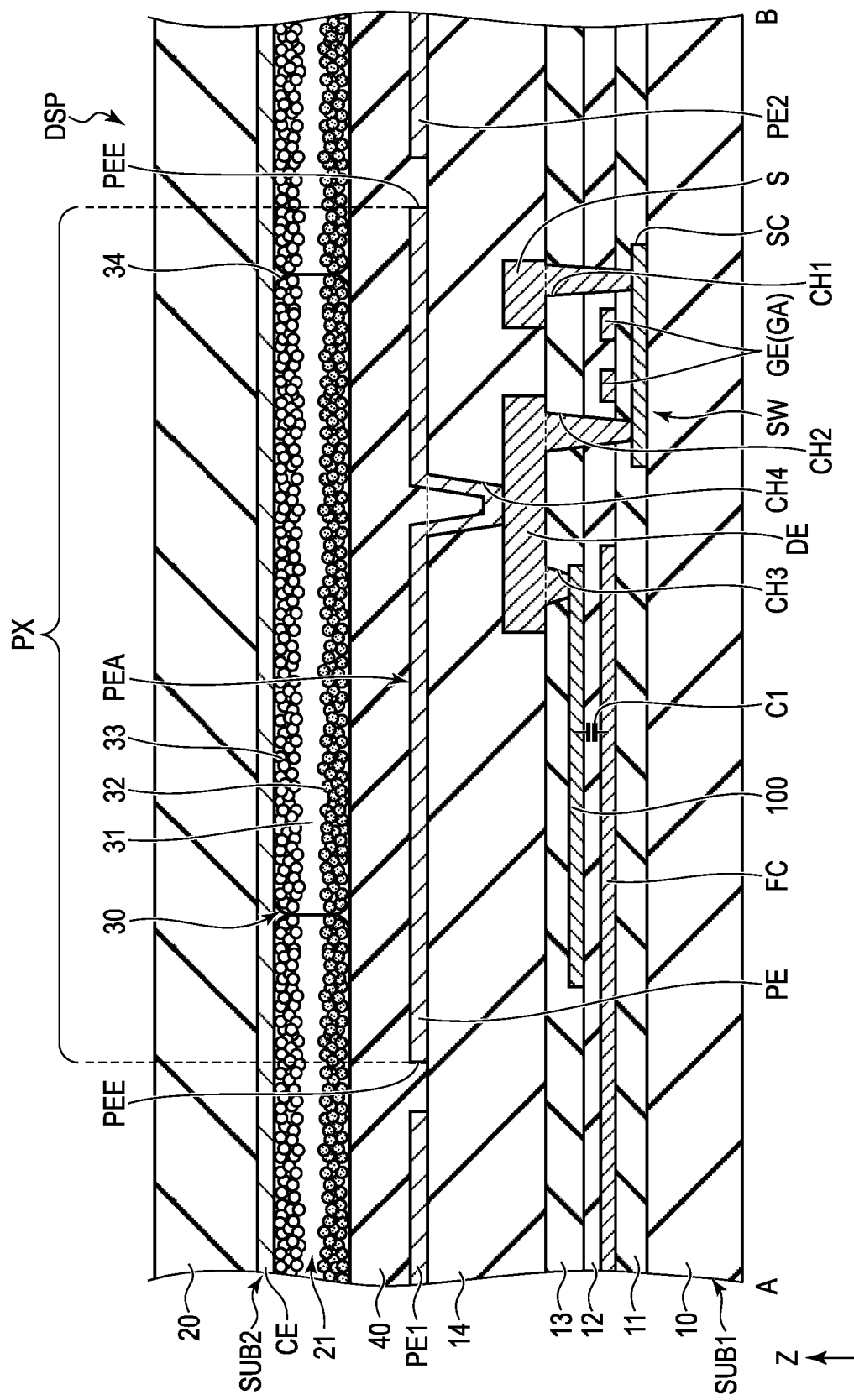
FIG. 10 is a cross-sectional view showing the fourth configuration example of the pixel PX of the display device DSP shown in FIG. 1.

FIG. 10 is a cross-sectional view showing the fourth configuration example of the pixel PX of the display device DSP shown in FIG. 1. The fourth configuration example shown in FIG. 10 is different from the first configuration example shown in FIG. 3 in that the switching element SW has a top-gate structure. That is, the semiconductor layer SC is located between the base 10 and the insulating film 11. Note that another insulating film may be interposed between the base 10 and the semiconductor layer SC. The gate electrode GE integrally formed with the conductive layer GA which is a scanning line is located between the insulating film 11 and the insulating film 12. The capacitive portion FC is located between the insulating film 11 and the insulating film 12. The capacitive electrode 100 is located between the insulating film 12 and the insulating film 13. The signal line S and the drain electrode DE are located between the insulating film 13 and the insulating film 14.

The signal line S is in contact with the semiconductor layer SC in the through hole CH1 which penetrates the insulating films 11 to 13. The drain electrode DE is in contact with the semiconductor layer SC in the through hole CH2 which penetrates the insulating films 11 to 13. In addition, the drain electrode DE is in contact with the capacitive electrode 100 in the through hole CH3 which penetrates the insulating film 13. The capacitance C1 is formed between the capacitive portion FC and the capacitive electrode 100 which are opposed to each other via the insulating film 12. The other configuration is the same as that of the first configuration example.

In the fourth configuration example, the insulating film 12 corresponds to the first inorganic insulating film, the insulating film 13 corresponds to the second inorganic insulating film, the insulating film 11 corresponds to the third inorganic insulating film, and the insulating film 14 corresponds to the organic insulating film.

Also in the fourth configuration example, substantially the same effects as those of the above-described first configuration example can be obtained.

Figure 11:
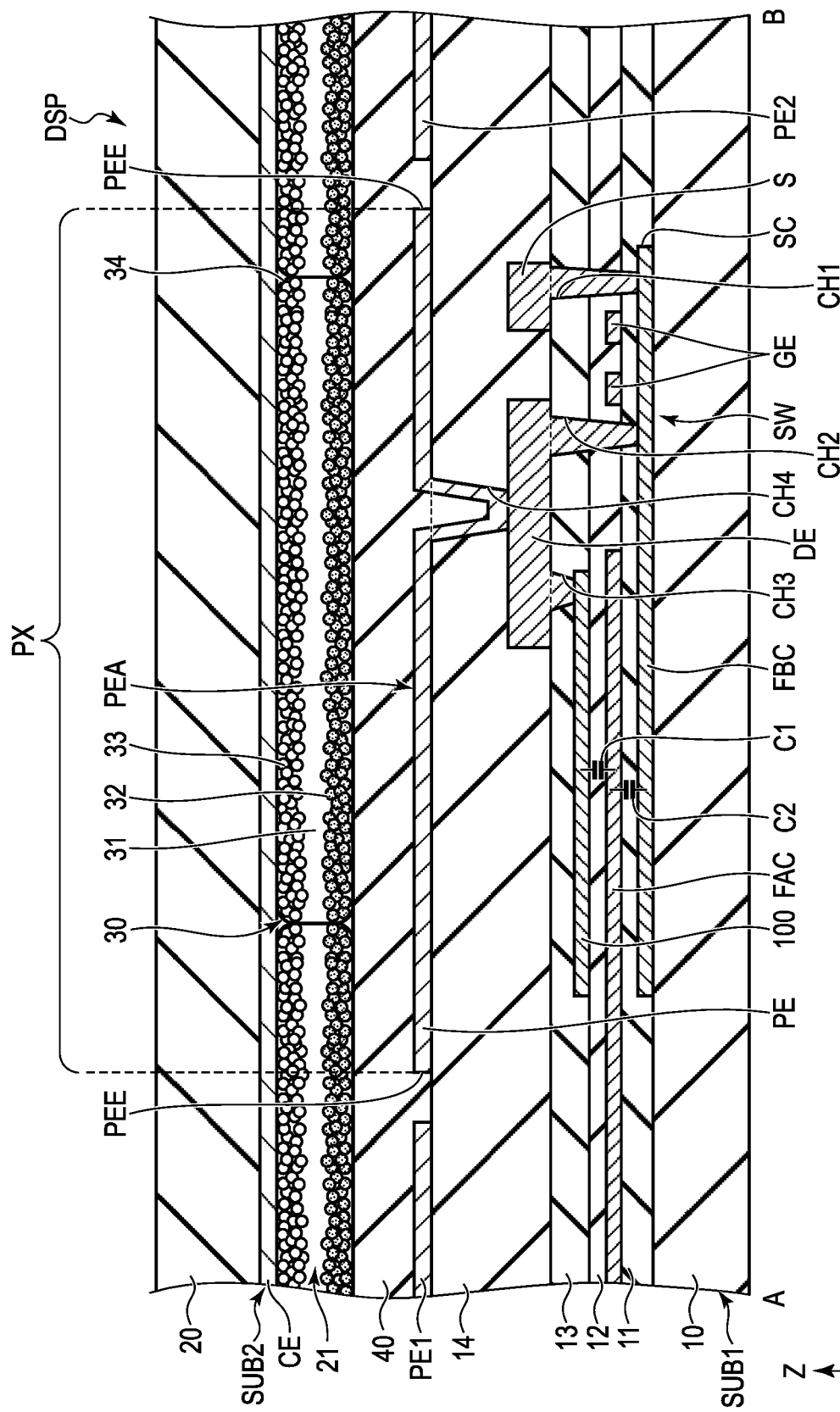
FIG. 11 is a cross-sectional view showing the fifth configuration example of the pixel PX of the display device DSP shown in FIG. 1.

FIG. 11 is a cross-sectional view showing the fifth configuration example of the pixel PX of the display device DSP shown in FIG. 1. The fifth configuration example shown in FIG. 11 is different from the fourth configuration example shown in FIG. 10 in that the semiconductor layer SC includes the capacitive portion FBC. The capacitive portion FBC is formed in an island shape in each pixel PX and is located between the base 10 and the insulating film 11. The drain electrode DE is in contact with the capacitive portion FBC in the through hole CH2 and is in contact with the capacitive electrode 100 in the through hole CH3. That is, the capacitive portion FBC and the capacitive electrode 100 are electrically connected to each other via the drain electrode DE and have the same potential. The capacitive portion FAC is located between the capacitive portion FBC and the capacitive electrode 100. The capacitance C1 is formed between the capacitive portion FAC and the capacitive electrode 100 which are opposed to each other via the insulating film 12. In addition, the capacitance C2 is formed between the capacitive portion FBC and the capacitive electrode 100 which are opposed to each other via the insulating film 11. The other configuration is the same as that of the first configuration example.

Also in the fifth configuration example, the capacitance per pixel can be increased in the same manner as that of the above-described third configuration example.

Figure 12:
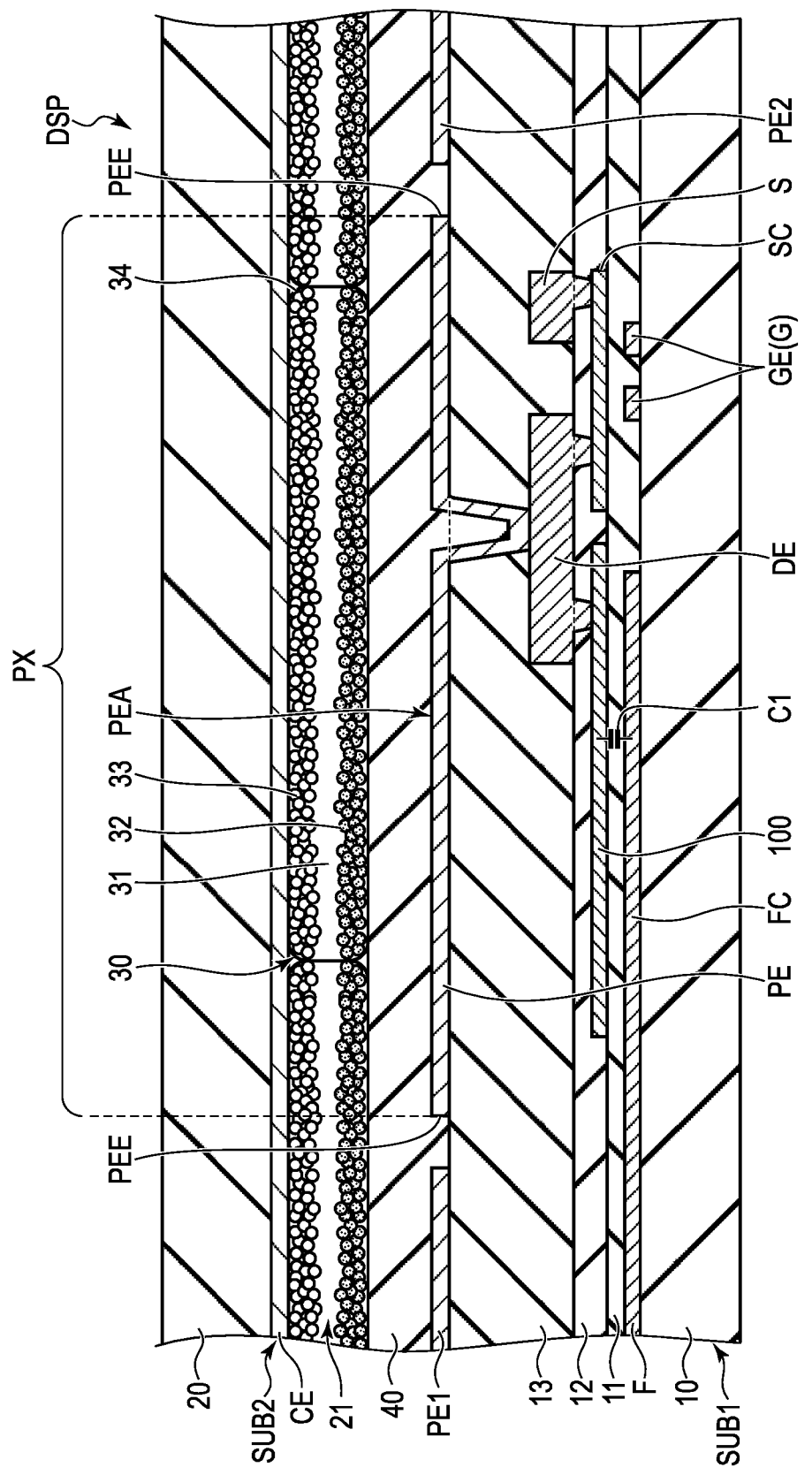
FIG. 12 is a cross-sectional view showing the sixth configuration example of the pixel PX of the display device DSP shown in FIG. 1.

FIG. 12 is a cross-sectional view showing the sixth configuration example of the pixel PX of the display device DSP shown in FIG. 1. In the sixth configuration example, the scanning line G has a single-layer structure. That is, the gate electrode GE integrally formed with the scanning line G and the feed line F including the capacitive portion FC are located between the base 10 and the insulating film 11. The semiconductor layer SC and the capacitive electrode 100 are located between the insulating film 11 and the insulating film 12. The capacitive electrode 100 is apart from the semiconductor layer SC. The signal line S and the drain electrode DE are located between the insulating film 12 and the insulating film 13. The capacitive electrode 100 is electrically connected to the pixel electrode PE via the drain electrode DE. The insulating films 11 and 12 are inorganic insulating films, and the insulating film 13 is an organic insulating film. The capacitance C1 is formed between the capacitive portion FC and the capacitive electrode 100 which are opposed to each other via the insulating film 11.

Also in the sixth configuration example, substantially the same effects as those of the above-described first configuration example can be obtained. In addition, as compared with the first configuration example, one conductive layer and one insulating layer can be omitted in the first substrate SUB1.

Figure 13:
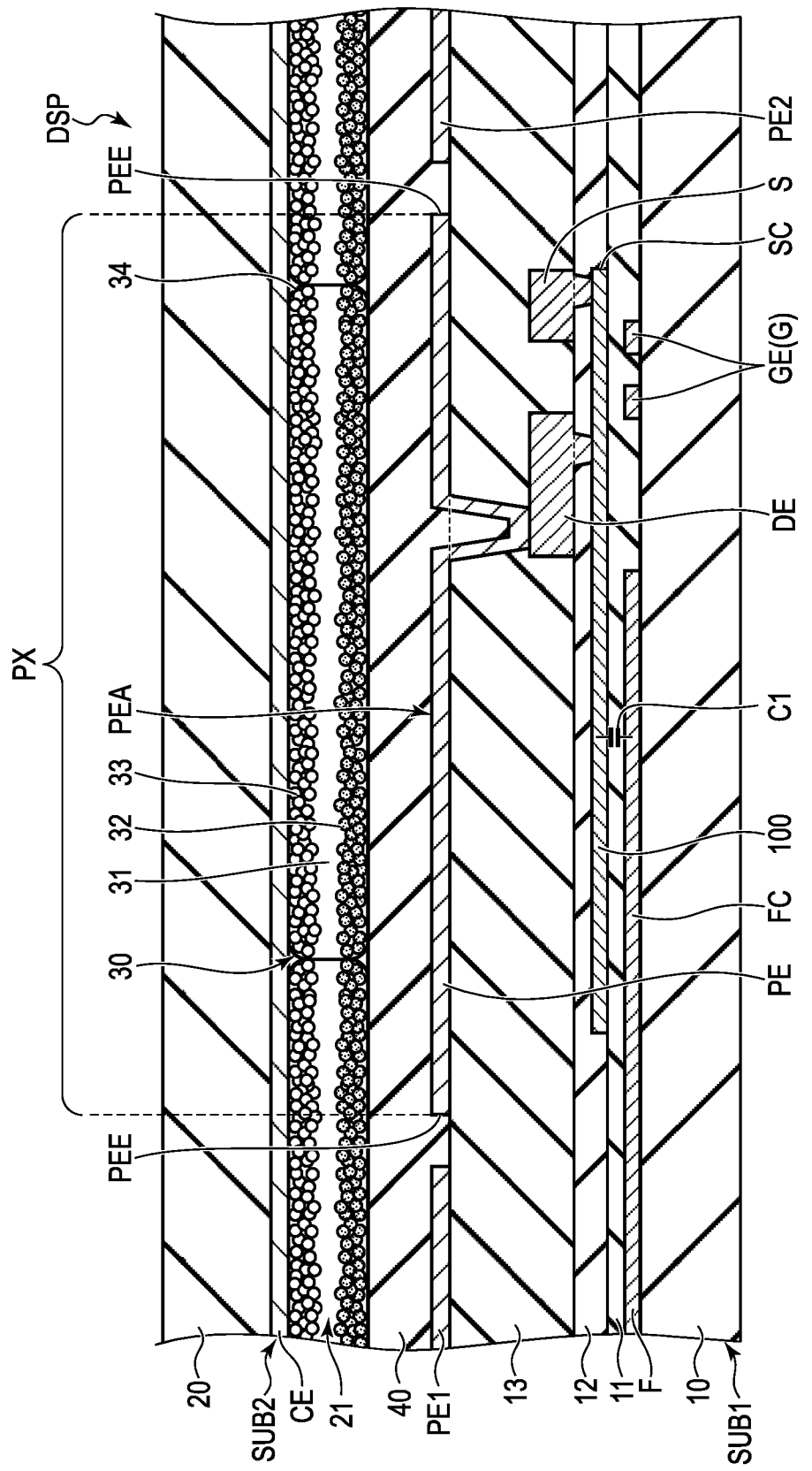
FIG. 13 is a cross-sectional view showing the seventh configuration example of the pixel PX of the display device DSP shown in FIG. 1.

FIG. 13 is a cross-sectional view showing the seventh configuration example of the pixel PX of the display device DSP shown in FIG. 1. The seventh configuration example shown in FIG. 13 is different from the sixth configuration example shown in FIG. 12 in that the capacitive electrode 100 is integrally formed with the semiconductor layer SC. Also in the seventh configuration example, the capacitance C1 is formed between the capacitive portion FC and the capacitive electrode 100 which are opposed to each other via the insulating film 11, and substantially the same effects as those of the sixth configuration example can be obtained.

As described above, according to the present embodiment, a display device which can suppress display quality degradation can be provided.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

An example of the display device obtained from the configuration disclosed in the specification will be additionally described below.

(1)

A display device including:
a base;
a scanning line including a first conductive layer and a second conductive layer overlapping the first conductive layer;
a first capacitive portion located in a same layer as the first conductive layer;
a second capacitive portion located in a same layer as the second conductive layer and overlapping the first capacitive portion;
a first inorganic insulating film located between the first conductive layer and the second conductive layer and between the first capacitive portion and the second capacitive portion;
a switching element including a drain electrode electrically connected to the second capacitive portion and a semiconductor layer electrically connected to the drain electrode;
a pixel electrode electrically connected to the drain electrode;
a common electrode having a same potential as the first capacitive portion; and
an electrophoretic element located between the pixel electrode and the common electrode.

(2)

The display device described in (1), further including:
a signal line electrically connected to the semiconductor layer; and
an organic insulating film located between the signal line and the pixel electrode, wherein
the electrophoretic element is bonded to the organic insulating film on an outer side of the pixel electrode.

(3)

The display device described in (2), further including:
a second inorganic insulating film located between the second capacitive portion and the semiconductor layer and being in contact with the first inorganic insulating film; and
a third inorganic insulating film located between the semiconductor layer and the drain electrode and being in contact with the second inorganic insulating film and the organic insulating film, wherein
the first conductive layer is located between the base and the semiconductor layer.

(4)

The display device described in (3), further including a third capacitive portion located in a same layer as the semiconductor layer, overlapping the second capacitive portion, and having a same potential as the first capacitive portion.

(5)

The display device described in (2), further including:
a second inorganic insulating film located between the second capacitive portion and the drain electrode and being in contact with the first inorganic insulating film and the organic insulating film; and
a third inorganic insulating film located between the semiconductor layer and the first capacitive portion and being in contact with the first inorganic insulating film, wherein
the semiconductor layer is located between the base and the first conductive layer.

(6)

The display device described in (5), further including a third capacitive portion located in a same layer as the semiconductor layer, overlapping the first capacitive portion, and having a same potential as the second capacitive portion.

(7)

The display device described in (1), wherein an edge of the first capacitive portion and an edge of the second capacitive portion each overlap the pixel electrode over an entire circumference thereof.

(8)

The display device described in (1), further including a feed line extending along a same direction as the scanning line, wherein
the feed line includes the first capacitive portion.

(9)

The display device described in (8), wherein
the feed line has a first width at a position overlapping the pixel electrode and has a second width on an outer side of the pixel electrode, and
the first width is less than a width of the first capacitive portion, and
the second width is less than the first width.

(10)

A display device including:
a base;
a first conductive layer and a first capacitive portion located above the base;
a first inorganic insulating film covering the first conductive layer and the first capacitive portion;
a second conductive layer located above the first inorganic insulating film and electrically connected to the first conductive layer;
a second capacitive portion located above the first inorganic insulating film and overlapping the first capacitive portion;
a second inorganic insulating film covering the second conductive layer and the second capacitive portion;
an organic insulating film located above the second inorganic insulating film;
a pixel electrode located above the organic insulating film;
a common electrode located above the pixel electrode and having a same potential as the first capacitive portion; and
an electrophoretic element located between the pixel electrode and the common electrode.

(11)

The display device described in (10), wherein the electrophoretic element is bonded to the organic insulating film on an outer side of the pixel electrode.

(12)
The display device described in (10), further including:
a third capacitive portion located above the second inorganic insulating film, overlapping the second capacitive portion, and having a same potential as the first capacitive portion; and
a third inorganic insulating film located between the second inorganic insulating film and the organic insulating film and covering the third capacitive portion.

(13)
The display device described in (10), further including:
a third capacitive portion located above the base, overlapping the first capacitive portion, and having a same potential as the second capacitive portion; and
a third inorganic insulating film located between the base and the first inorganic insulating film and covering the third capacitive portion.

(14)
A display device including:
a base:
a scanning line including a first conductive layer and a second conductive layer overlapping the first conductive layer;
a first capacitive portion located in a same layer as the first conductive layer;
a second capacitive portion located in a same layer as the second conductive layer and overlapping the first capacitive portion;
a first inorganic insulating film located between the first conductive layer and the second conductive layer and between the first capacitive portion and the second capacitive portion;
a switching element including a drain electrode electrically connected to the second capacitive portion and a semiconductor layer electrically connected to the drain electrode; and
a pixel electrode electrically connected to the drain electrode.

(15)
The display device described in (14), further including:
a second inorganic insulating film located between the second capacitive portion and the semiconductor layer and being in contact with the first inorganic insulating film; and
a third inorganic insulating film located between the semiconductor layer and the drain electrode and being in contact with the second inorganic insulating film and the organic insulating film, wherein
the first conductive layer is located between the base and the semiconductor layer.

(16)
The display device described in (15), further including a third capacitive portion located in a same layer as the semiconductor layer, overlapping the second capacitive portion, and having a same potential as the first capacitive portion.

(17)
The display device described in (14), further including:
a second inorganic insulating film located between the second capacitive portion and the drain electrode and being in contact with the first inorganic insulating film and the organic insulating film; and
a third inorganic insulating film located between the semiconductor layer and the first capacitive portion and being in contact with the first inorganic insulating film, wherein
the semiconductor layer is located between the base and the first conductive layer.

(18)
The display device described in (17), further including a third capacitive portion located in a same layer as the semiconductor layer, overlapping the first capacitive portion, and having a same potential as the second capacitive portion.

What is claimed is:

1. A display device comprising:
a base;
a scanning line comprising a first conductive layer and a second conductive layer overlapping the first conductive layer;
a first capacitive portion located in a same layer as the first conductive layer;
a second capacitive portion located in a same layer as the second conductive layer and overlapping the first capacitive portion;
a first inorganic insulating film located between the first conductive layer and the second conductive layer and between the first capacitive portion and the second capacitive portion;
a switching element comprising a drain electrode electrically connected to the second capacitive portion and a semiconductor layer electrically connected to the drain electrode;
a pixel electrode electrically connected to the drain electrode;
a common electrode having a same potential as the first capacitive portion; and
an electrophoretic element located between the pixel electrode and the common electrode.

2. The display device of claim 1, further comprising:
a signal line electrically connected to the semiconductor layer; and
an organic insulating film located between the signal line and the pixel electrode, wherein
the electrophoretic element is bonded to the organic insulating film on an outer side of the pixel electrode.

3. The display device of claim 2, further comprising:
a second inorganic insulating film located between the second capacitive portion and the semiconductor layer and being in contact with the first inorganic insulating film; and
a third inorganic insulating film located between the semiconductor layer and the drain electrode and being in contact with the second inorganic insulating film and the organic insulating film, wherein
the first conductive layer is located between the base and the semiconductor layer.

4. The display device of claim 3, further comprising a third capacitive portion located in a same layer as the semiconductor layer, overlapping the second capacitive portion, and having a same potential as the first capacitive portion.

5. The display device of claim 2, further comprising:
a second inorganic insulating film located between the second capacitive portion and the drain electrode and being in contact with the first inorganic insulating film and the organic insulating film; and
a third inorganic insulating film located between the semiconductor layer and the first capacitive portion and being in contact with the first inorganic insulating film, wherein
the semiconductor layer is located between the base and the first conductive layer.

6. The display device of claim 5, further comprising a third capacitive portion located in a same layer as the semiconductor layer, overlapping the first capacitive portion, and having a same potential as the second capacitive portion.

7. The display device of claim 1, wherein an edge of the first capacitive portion and an edge of the second capacitive portion each overlap the pixel electrode over an entire circumference thereof.

8. The display device of claim 1, further comprising a feed line extending along a same direction as the scanning line, wherein
the feed line includes the first capacitive portion.

9. The display device of claim 8, wherein
the feed line has a first width at a position overlapping the pixel electrode and has a second width on an outer side of the pixel electrode, and
the first width is less than a width of the first capacitive portion, and
the second width is less than the first width.

10. A display device comprising:
a base;
a first conductive layer and a first capacitive portion located above the base;
a first inorganic insulating film covering the first conductive layer and the first capacitive portion;
a second conductive layer located above the first inorganic insulating film and electrically connected to the first conductive layer;
a second capacitive portion located above the first inorganic insulating film and overlapping the first capacitive portion;
a second inorganic insulating film covering the second conductive layer and the second capacitive portion;
an organic insulating film located above the second inorganic insulating film;
a pixel electrode located above the organic insulating film;
a common electrode located above the pixel electrode and having a same potential as the first capacitive portion;
an electrophoretic element located between the pixel electrode and the common electrode;
a third capacitive portion located above the second inorganic insulating film, overlapping the second capacitive portion, and having a same potential as the first capacitive portion; and
a third inorganic insulating film located between the second inorganic insulating film and the organic insulating film and covering the third capacitive portion.

11. A display device comprising:
a base;
a first conductive layer and a first capacitive portion located above the base;
a first inorganic insulating film covering the first conductive layer and the first capacitive portion;
a second conductive layer located above the first inorganic insulating film and electrically connected to the first conductive layer;
a second capacitive portion located above the first inorganic insulating film and overlapping the first capacitive portion;
a second inorganic insulating film covering the second conductive layer and the second capacitive portion;
an organic insulating film located above the second inorganic insulating film;
a pixel electrode located above the organic insulating film;
a common electrode located above the pixel electrode and having a same potential as the first capacitive portion;
an electrophoretic element located between the pixel electrode and the common electrode;
a third capacitive portion located above the base, overlapping the first capacitive portion, and having a same potential as the second capacitive portion; and
a third inorganic insulating film located between the base and the first inorganic insulating film and covering the third capacitive portion.

12. A display device comprising:
a base;
a scanning line comprising a first conductive layer and a second conductive layer overlapping the first conductive layer;
a first capacitive portion located in a same layer as the first conductive layer;
a second capacitive portion located in a same layer as the second conductive layer and overlapping the first capacitive portion;
a first inorganic insulating film located between the first conductive layer and the second conductive layer and between the first capacitive portion and the second capacitive portion;
a switching element comprising a drain electrode electrically connected to the second capacitive portion and a semiconductor layer electrically connected to the drain electrode; and
a pixel electrode electrically connected to the drain electrode.

13. The display device of claim 12, further comprising:
a second inorganic insulating film located between the second capacitive portion and the semiconductor layer and being in contact with the first inorganic insulating film; and
a third inorganic insulating film located between the semiconductor layer and the drain electrode and being in contact with the second inorganic insulating film and an organic insulating located above the second inorganic insulating film, wherein
the first conductive layer is located between the base and the semiconductor layer.

14. The display device of claim 11, further comprising a third capacitive portion located in a same layer as the semiconductor layer, overlapping the second capacitive portion, and having a same potential as the first capacitive portion.

15. The display device of claim 12, further comprising:
a second inorganic insulating film located between the second capacitive portion and the drain electrode and being in contact with the first inorganic insulating film and the organic insulating film; and
a third inorganic insulating film located between the semiconductor layer and the first capacitive portion and being in contact with the first inorganic insulating film, wherein
the semiconductor layer is located between the base and the first conductive layer.

16. The display device of claim 15, further comprising a third capacitive portion located in a same layer as the semiconductor layer, overlapping the first capacitive portion, and having a same potential as the second capacitive portion.

* * * * *